Nov. 21, 1967

F. J. CAMPAGNA ET AL

INTEGRATED CIRCUITS WITH ACTIVE ELEMENTS ISOLATED BY INSULATING MATERIAL

Filed Dec. 24, 1964

3,354,360

INVENTORS
FRANK J. CAMPAGNA
LAWRENCE V. GREGOR
DONALD P. SERAPHIM

BY [signature]
ATTORNEY

United States Patent Office 3,354,360

Patented Nov. 21, 1967

3,354,360

INTEGRATED CIRCUITS WITH ACTIVE ELEMENTS ISOLATED BY INSULATING MATERIAL

Frank J. Campagna, Brewster, Lawrence V. Gregor, Crompond, and Donald P. Seraphim, Bedford Hills, N.Y., assignors to International Business Machines Corporation, New York, N.Y., a corporation of New York Filed Dec. 24, 1964, Ser. No. 421,029
9 Claims. (Cl. 317—234)

This invention relates to a preformed semiconductor wafer suitable for integrated circuit arrangements and which includes an inlaid pattern of insulating material for minimizing capacitance of functional interconnections, e.g., thin film conductors, thin film resistors, thin film inductors, etc. Integrated circuit arrangements implies that a number of active circuit elements along with functional interconnections therebetween are formed on a single semiconductor wafer.

With the development of large and complex electronic equipments and the attendant high manufacturing cost, effort is being expended by industry to batch-fabricate large numbers of active circuit elements along with functional interconnections on a single semiconductor wafer. The objective of such effort is to reduce the physical size and objectionable high cost of these equipments and, in addition, to provide reliability and optimum power utilization from the system viewpoint. A large portion of this effort is based upon known semiconductor technology wherein the active circuit elements are diffused into the semiconductor wafer, such wafer forming an essential constituent of such elements and providing structural support therefor. Functional interconnections between active circuit elements can be defined either by thin metallic films or diffused regions in the wafer proper, e.g., diffused conductors, diffused crossunder connections, diffused resistors, etc.

Important development remains to be done in the actual integration of active circuit elements into operative arrangements as certain limitations are inherent in these prior art monolithic structures. One such limitation is "cross-talk" between active circuit elements when formed in a monocrystalline semiconductor wafer. In prior art monolithic structures, a measure of isolation between active circuit elements is achieved since each defines a normally back-biased "p-n" junction within the wafer proper; complete isolation is not achieved, however, due to capacitance associated with such junctions. Many alternate techniques have been suggested to eliminate "cross-talk" between active circuit devices in monolithic structures, for example, as described by R. S. Schwartz, in the article, "Integrated Circuit Package," IBM Technical Disclosure Bulletin, vol. 3, No. 12, May 1961. Another severe limitation in prior art monolithic structures is the capacitance associated with functional interconnections formed as thin metallic films. Thin film functional interconnections exhibit a low impedance per unit length and, accordingly, are preferred over diffused-type functional interconnections. Thin film functional interconnections are planar structures formed either by vapor deposition or photoresist techniques and insulated from the semiconductor wafer by a thin insulating film, e.g., silicon dioxide ($SiO_2$), whereby a "capacitor-like" structure is defined. Stray capacitance introduced along such "capacitor-like" structure significantly affects high frequency operation of the integrated circuit arrangement. Accordingly, the operation of integrated circuit arrangements would be significantly improved if stray capacitance associated with these preferred functional interconections was minimal.

Accordingly, an object of this invention is to provide an improved monolithic integrated circuit structure wherein capacitance associated with functional interconnections between active circuit elements is minimal.

Another object of this invention is to provide a monolithic integrated circuit structure wherein capacitance associated with functional interconnections is minimized while providing a final planar circuit topology.

Another object of this invention is to reduce capacitive coupling between functional interconnections and the semiconductor wafer in a monolithic integrated circuit structure by inlaying a pattern of insulating material within selected surface portions of such wafer.

Another object of this invention is to provide a preformed semiconductor wafer suitable for monolithic integrated circuit arrangements.

The capacitance of the "capacitor-like" structure defined between functional interconnections and the semiconductor wafer is proportional to the opposing surface areas and inversely proportional to the thickness of the insulating film, e.g., in the order of 5000 A., of given dielectric constant. In the present technology, the major surface areas of functional interconnections are minimized to reduce capacitive coupling therebetween and the semiconductor wafer. For example, thin film conductors are presently formed having widths in the order of 1 mil (.001 inch). However, as resistance of a thin film conductor is related to its length-width ratio (ohms-□), the resistance or impedance of the thin film conductor is correspondingly increased and a design compromise is forced upon a circuit designer. Also, attempts to increase the thickness of the insulating layer have not proven successful for a number of reasons. For example, the time required to form thicker insulating layers on the surface of the semiconductor wafer by conventional techniques is prohibitive; if thicker insulating layers are formed only between functional interconnections and the semiconductor wafer, the resulting uneven topology would substantially complicate deposition of continuous thin conductive films of narrow width. Also, the problem of mismatch between the respective coefficients of linear expansion of thicker insulating layers and the semiconductor wafer would be more severe; the tendency would be for the thicker insulating layer to crack for smaller variations in temperature.

In accordance with this invention, the capacitance associated with functional interconnections in an integrated circuit arrangement is minimized while providing a final planar circuit topology by forming a thick insulating layer in inlaid fashion below the surface of the semiconductor wafer. In the preferred method, the particular areas of the semiconductor wafer over which functional interconnections are to be made, hereinafter designated interconnection regions, are selectively etched to provide a particular pattern of recesses, or valleys, while surface areas in which active circuit elements, e.g., bipolar transistors, field effect transistors, diodes, etc., are to be diffused, hereinafter designated diffusion regions, are protected by appropriate masking techniques. Insulating material, e.g., silicon dioxide ($SiO_2$), is then formed by anodic processes over the entire surface of the semiconductor wafer at least in excess of the depth of the etched recesses, e.g., 10 microns. Insulating material formed over the diffusion regions is removed by appropriate techniques and the resulting wafer structure, including the inlaid pattern of thick insulating material defining the interconnection regions, is subjected to a mechanical lapping and chemical polishing to insure a final planar circuit topology. Active circuit elements and functional interconnections therebetween are formed by conventional metallizing techniques, the inlaid pattern of thick insulating material being effective to substantially minimize the capacitance of the functional interconnections.

In accordance with other aspects of this invention, "field effect cross-talk" between adjacent diffused crossunder connections is very substantially minimized. For example, a thin film conductor passing over adjacent crossunder connections defines, in effect, an insulated-gate field effect transistor wherein the adjacent crossunder connections define "source" and "drain" electrodes, respectively, and the thin film conductor defines the gate electrode. The structure of an insulated-gate field effect transistor is more particularly described in copending U.S. patent application Ser. No. 392,144, filed on Aug. 26, 1964 in the name of A. E. Brennemann et al., entitled "Method for Fabricating Insulated-Gate Field Effect Transistor," and assigned to a common assignee. Accordingly, electrical fields generated by the thin film conductor can induce conduction between the adjacent crossunder connections. "Cross-talk" between adjacent crossunder connections is very substantially minimized when crossunder connections are diffused in the trough of the etched recesses defining the interconnection region prior to formation of the inland pattern of insulating material. Accordingly, the intensity of electrical fields applied to portions of the semiconductor wafer intermediate the adjacent crossunder connections is correspondingly reduced and "cross-talk" therebetween virtually eliminated.

The foregoing and other objects, features and advantages of the invention will be apparent from the following more particular description of preferred embodiments of the invention, as illustrated in the accompanying drawings.

Figure 1A:
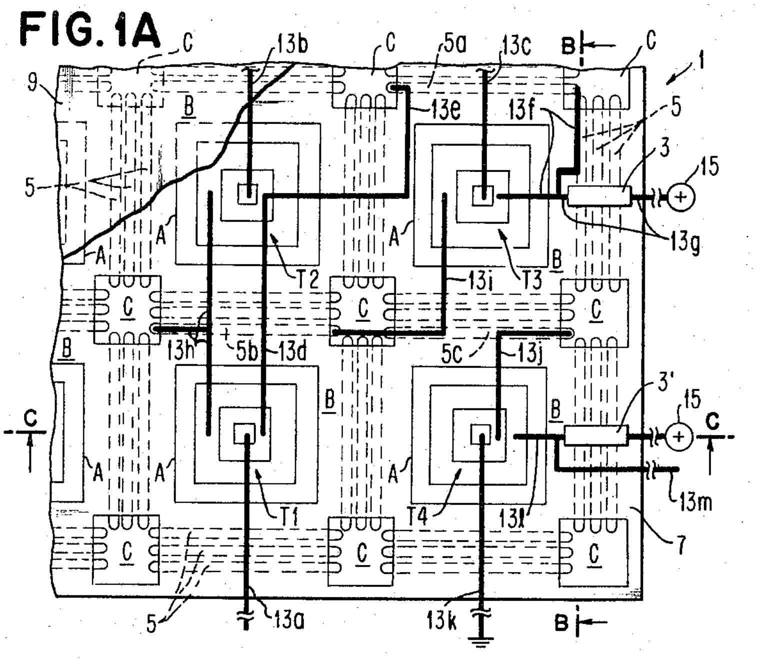
FIG. 1A is a top view of an integrated circuit arrangement formed on a semiconductor wafer which has been preformed in accordance with this invention.
Figure 1B:
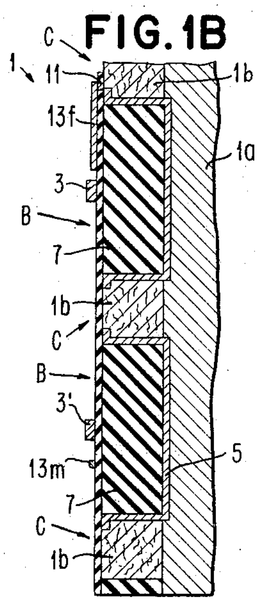
FIGS. 1B and 1C are sectional views of the integrated circuit arrangement of FIG. 1A and taken along the lines B—B and C—C, respectively.
Figure 1C:
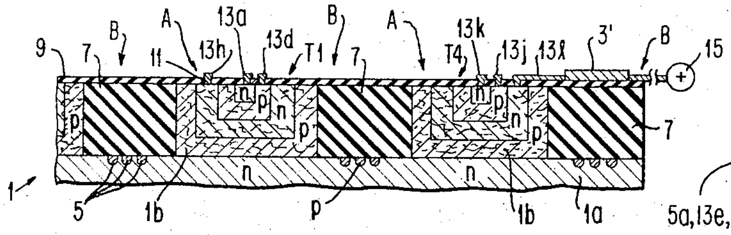
Figure 1D:
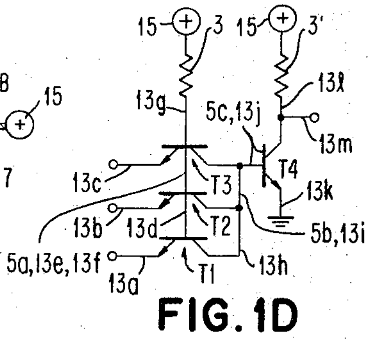
FIG. 1D is a schematic diagram of the AND-INVERT integrated circuit arrangement of FIG. 1A.

Referring to FIGS. 1A, 1B, and 1C, an integrated circuit arrangement illustrated schematically in FIG. 1D is formed on planar semiconductor wafer 1 which has been preformed in accordance with this invention. In the description hereinafter set forth, reference is made concurrently to FIGS. 1A, 1B, 1C, and 1D wherein same reference characters identify identical structures.

By a process hereinafter described, wafer 1 comprises a monocrystalline p-type semiconductor body 1*a* having an oriented surface and exhibiting relatively high resistivity, e.g., in the order of 10 ohm-cm., and layer 1*b* of epitaxially-grown n-type semiconductor material of lower resistivity, i.e., in the order of 1 ohm-cm., formed thereover. As hereinafter evident, the body 1*a* can be defined by an insulating supporting substrate, e.g., glass. As illustrated, n-p-n transistors T1 through T4 have been formed by diffusion processes in diffusion regions A of wafer 1 and are functionally integrated by thin metallic film conductors and, also, thin film resistors 3 and 3' over interconnection regions B of wafer 1. Also, remaining portions of wafer 1 have been designated crossunder connection regions C whereat diffused crossunder connections 5 are selectively connected in any desired pattern. As hereinafter described, the surfaces of diffusion regions A and crossunder connection regions C are defined by the original surface of epitaxial layer 1*b*; interconnection region B is defined by an inlaid pattern of thick insulating material 7 which, as illustrated in FIGS. 1B and 1C, extends to the surface of semiconductor body 1*a* so as to isolate (1) functional interconnections on wafer 1 and, also, crossunder diffusions 5 whereby capacitance therebetween is very substantially reduced and (2) individual diffusion areas A, coupling therebetween along the high-resistivity semiconductor body 1*a* being minimal.

The integrated circuit arrangement of FIGS. 1A, 1B, and 1C is formed in a two-step process. The first process step, as hereinafter described, relates to forming the inlaid pattern of thick insulating material 7 in wafer 1 to define the array of diffusion regions A while providing a final planar circuit topology. Such first process step includes defining the array of crossunder connection regions C and, also, the diffusion of crossunder connections 5, if desired. The second process step includes the diffusing of transistors T1 through T4 in diffusion regions A and the functional interconnecting of such elements as shown in FIG. 1D and, also, of the crossunder connections 5. As shown, transistors T1 through T4 are of the n-p-n type and each includes emitter, base, and collector electrodes diffused within a corresponding diffusion area A. In the final arrangement, a thin insulating layer 9 is formed over the surface of wafer 1 subsequent to the first process step and is conventionally used as a mask during diffusion of transistors T1 through T4. For example, the insulating layer 9 is thermally-grown silicon dioxide prepared by exposing wafer 1 at temperatures between 950° C. and 1150° C. to an atmosphere of either oxygen ($O_2$), water vapor ($H_2O$), oxygen and water vapor ($O_2+H_2O$), or carbon dioxide ($CO_2$). When formed, openings 11 are etched in insulating layer 9 by standard photoresist techniques to allow functional interconnection of transistors T1 through T4 by means of thin film conductors 13 and particular crossunder connections 5. As illustrated in FIGS. 1A and 1D, an AND-INVERT circuit is formed by connecting the emitter electrodes of transistors T1, T2, and T3 to sources of input signals, not shown, along thin film conductors 13*a*, 13*b*, and 13*c*, respectively. The base electrodes of transistors T1, T2, and T3 are multiplied along thin film conductors 13*d* and 13*e*, crossunder connection 5*a* and thin film conductor 13*f*; such multiplied electrodes are connected to positive voltage source 15 along thin film conductor 13*g* which includes as an integral segment thin film resistor 3, for example, formed of tantalum by vapor deposition processes. Also, the collector electrodes of transistors T1, T2, and T3 are multipled along thin film conductors 13*h* and 13*i* and crossunder connection 5*b* and to the base electrode of transistor T4 along crossunder connection 5*c* and thin film conductor 13*j*. The emitter electrode of transistor T4 is connected to ground along thin film conductor 13*k*. To complete the circuit arrangement, the collector electrode of transistor T4 is connected to voltage source 15 along thin film conductor 13*l* which includes as an integral segment thin film resistor 3', the output signal being connected along thin film conductor 13*m* to a utilization device, not shown. It is to be noted that crossunder connections, for example, 5*a*, 5*b*, and 5*c*, are immediately available to allow maximum flexibility in the interconnection pattern.

To form the interconnection pattern hereinabove described, holes 11 are etched through insulating layer 9 by appropriate photoresist techniques where electrical connections are to be made to particular electrodes of transistors T1 through T4 and also particular crossunder connections 5. A thin film of conductive material, e.g., aluminum, molybdenum, etc., is then vapor deposited over the entire surface of thin insulating layer 9 and is continuous through openings 11 with the particular electrodes of transistors T1 through T4 and also crossunder connections 5. Utilizing photoresist techniques, portions of this thin film of conductive material are removed to define the desired patterns of thin film conductors 13. To form load resistors 3 and 3', thin film conductors 13*g* and 13*l*, respectively, are formed in discontinuous fashion and thin film resistors are deposited in electrically integral fashion to connect the discontinuous portions.

The structure illustrated in FIGS. 1A, 1B, and 1C differs from prior art structures in that wafer 1 is preformed to define interconnection regions B by an inlaid pattern of thick insulating material 7. In prior art monolithic structures, such regions would be defined by the original surface of the wafer 1 covered by thin insulating layer 9, e.g., in the range of 5000 A., whereby substantial capacitance was introduced into the circuit arrangement. In the preferred method, selected surface areas of the semiconductor wafer 1 which define interconnection regions B are preferentially etched such that diffusion regions A and crossunder connection regions C are defined by plateau-like structures. Crossunder connections 5 are continuous at the surface areas of crossunder connection regions C whereby connections therebetween can be made, as described, by standard metallization techniques. Insulating material 7 is deposited in the troughs of interconnection regions B, preferably by an anodization process, to define a final planar circuit topology and facilitate deposition of functional interconnections. Accordingly, functional interconnections between the active circuit devices, i.e., transistors T1 through T4, at interconnection regions B and, also, between diffused crossunder connections at regions C are planar. Thin insulating layer 9 formed over the entire surface of wafer 1 insulates the functional interconnections at diffusion regions A and crossunder connection regions C. Accordingly, capacitance associated with functional interconnections and also "field effect cross-talk" between adjacent diffused crossunder connections 5 are minimal.

A preferred process for achieving the objects of this invention is illustrated in the process steps of FIGS. 2A through 2H. The individual process steps hereinafter described utilize conventional techniques but result in an inlaid pattern of insulating material 7 in selected portions of wafer 1 defining interconnection regions B. The process steps, as described, provide a final planar circuit topology wherein the diffusion regions A and, also, crossunder connection regions C, here represented as regions R, are defined by the original surface of the epitaxial layer **1*b* of wafer 1**.

Figure 2A:
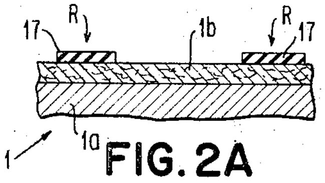
FIGS. 2A through 2H show the successive steps in preforming the semiconductor wafer of FIG. 1A.
Figure 2B:
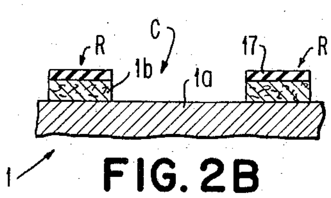
Figure 2C:
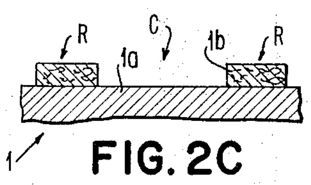

Referring to FIG. 2A, p-type semiconductor body **1*a* has been exposed, for example, to an atmosphere of silicon tetrachloride ($SiCl_4$) and a carrier gas, e.g., hydrogen ($H_2$), at an elevated temperature between 1100° C. and 1250° C. for a time at least sufficient to form p-type epitaxial layer 1*b*, e.g., in the order of 10 microns. A layer 17 of negative photoresist material is formed over epitaxial layer 1*b* and exposed, either photolytically by employing pattern-defining masks, by programmed particle bombardment, or by maskless exposure, in accordance with the desired pattern of regions R to be provided on the wafer 1. When photoresist layer 17 is developed, an etch-resistant mask remains over surface portions of epitaxial layer 1*b* designated regions R whereas surface portions corresponding to interconnection regions B are exposed. Selective etching of epitaxial layer 1*b* is then effected by standard processes, for example, by exposure to a 3:2:1 solution of nitric acid ($HNO_3$); hydrofluoric acid (HF); acetic acid ($HC_2H_3O_2$). Preferably, epitaxial layer 1*b* is etched deeply enough so as to expose the underlying surface of semiconductor wafer 1*a*, as shown in FIG. 2B. Such technique affords more effective isolation between the regions R since such structures are interconnected solely along the high-resistivity semiconductor body 1*a*. Accordingly, and referring to FIG. 1C, transistor structures diffused into diffusion areas A are thus effectively isolated; further isolation is afforded to each transistor structure by the "p-n" junction defined between the n-type collector electrode diffusion and the p-type diffusion regions A. When the etch-resistant mask is removed, as shown in FIG. 2C, the resulting structure defines a particular pattern of plateau-like regions R formed of epitaxial layer 1*b* and a pattern of deep recesses extending through epitaxial layer 1*b*** corresponding to interconnecting regions B.

Figure 2D:
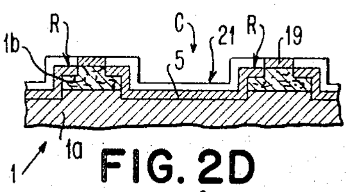

The process step of FIG. 2D is included when crossunder connections 5 are desired between particular regions R corresponding to crossunder connection regions C of FIGS. 1A and 1C; crossunder connections 5 need not be provided between regions R corresponding to diffusion areas A of FIGS. 1A and 1B. If no crossunder connections 5 are required in wafer 1, the structure of FIG. 2C would include only the pattern of plateau-like regions R corresponding to diffusion areas A. As shown in FIG. 2D, a thin oxide layer 19 is genetically formed, e.g., in the order of 10,000 A., by exposing the structure of FIG. 2C, for example, to a water vapor atmosphere at 1000° C. for several hours. The thickness of epitaxial layer **1*b* is slightly reduced since a portion thereof enters into the forming of oxide layer 19. An opening 21 corresponding to each crossunder connection 5 is selectively etched in the oxide layer 19 by conventional photoresist techniques to form a diffusion mask, each opening 21 extending to the planar surface of adjacent regions R (c.f., FIG. 1A). The structure of FIG. 2D is then exposed to a gaseous phosphorus pentoxide ($P_2O_5$) at an elevated temperature in the range of 1050° C. to form relatively deep extrinsic diffusions defining individual crossunder connections 5 which extend to the surfaces of adjacent regions R. Subsequently, thin oxide layer 19** is stripped by conventional techniques.

Figure 2E:
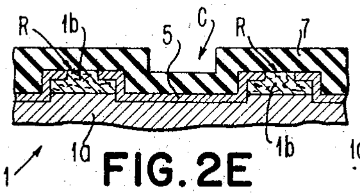
Figure 2F:
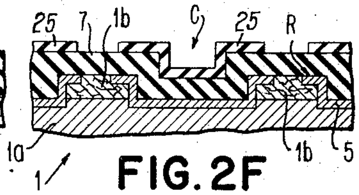
Figure 2G:
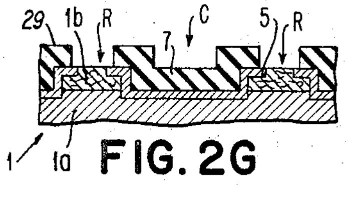
Figure 2H:
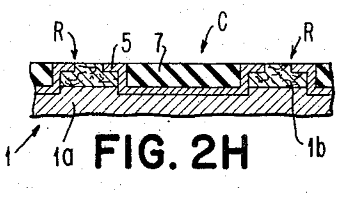

In the subsequent steps 2E through 2H, the partially-formed structure of FIG. 2D is treated to provide a final planar circuit topology by genetically forming insulating layer 7 within the etched recesses defining interconnection regions B. As illustrated in FIG. 2E, the partially-formed structure is subjected to an anodization process, for example, similar to that described in "Anodic Formation of Oxide Films on Silicon" by P. F. Schmidt et al., Journal of the Electrochemical Society, April 1957, pages 230 through 236. In such process, the partially-formed structure is immersed in sulphuric acid ($H_2SO_4$) and a voltage, e.g., in the range of 200 volts to 300 volts, is applied therebetween and an appropriate cathode, e.g., formed of platinum. Hydrated sulphate ions ($SO_4$—) in the electrolyte are attracted onto the surface and a reaction occurs to form a layer of silicon dioxide thereon. The anodization process is continued until insulating layer 7 builds up at least sufficient to fill in the recesses defining interconnection regions B. The thickness of epitaxial layer **1*b* defining diffusion regions A, crossunder connection regions C and, also, crossunder connections 5 are somewhat reduced as narrow surface portions thereof enter into the formation of insulating layer 7. In FIGS. 2F and 2G, portions of insulating layer 7 formed over regions R are selectively removed by conventional photoresist techniques. In FIG. 2F, a second thin layer 25 of negative photoresist material is formed over insulating layer 7 and exposed, as shown, in a pattern which does not correspond identically to the dimensions of interconection regions B; photoresist layer 25 is unexposed slightly beyond the edges of interconnection regions B to insure final planar circuit topology, as hereinafter described. Photoresist layer 25 is then developed and partially-formed wafer 1 is exposed to an appropriate etchant to remove portions of the insulating layer 7 from over regions R as shown in FIG. 2G. It will be noted that a narrow land 29 of insulating layer 7 remains over the interface of regions R and interconnection regions B which insures no portion of the anodized insulating layer is etched below the final circuit topology. For example, if photoresist layer 25 had been so exposed, subsequent etching could reduce the level of insulating layer 7 along the edges of interconnection regions B and result in discontinuous functional interconnections. The structure of FIG. 2G is fully formed by removing the unexposed photoresist layer 25 and subjecting the structure to fine mechanical lapping and chemical polishing, e.g., by immersion in sodium hydroxide (NaOH), to remove the narrow lands 29 of insulating layer 7 and insure the final planar circuit topology as shown in FIG. 2H. Finally, a thin oxide layer 9** (c.f., FIG. 1A) is formed over regions R and, also, the inlaid pattern of insulating material 7 by conventional techniques. Oxide layer 9, as hereinabove described, can be employed for masking during the diffusion and metallization in forming the monolithic structure of FIG. 1A.

Accordingly, the semiconductor wafer 1 is preformed to include an inlaid pattern of insulating material 7 and exposed diffusion areas A wherein active circuit elements can be formed and functionally interconnected by conventional processes. In addition, diffused crossunder connections 5 are available where crossover connections are necessary on semiconductor wafer 1. The provision of inlaid patterns of insulating material 7 in accordance with this invention affords a final planar circuit topology while minimizing capacitance associated with the functional interconnections in the monolithic structure.

While the invention has been particularly shown and described with reference to preferred embodiments thereof, it will be understood by those skilled in the art that various changes in form and details may be made therein without departing from the spirit and scope of the invention.

What is claimed is:

1. A semiconductor circuit arrangement comprising a semiconductor body of first conductivity type having a pattern of electrically isolated regions having surface portions and an inlaid pattern of insulating material, said patterns being complementary and defining a planar topology, active circuit elements formed within selected ones of said surface portions, and means for functionally interconnecting said active devices to form an operative circuit arrangement, said interconnecting means including first conductive means passing over said inlaid pattern and second conductive means passing beneath said inlaid pattern.

2. A semiconductor circuit arrangement as defined in claim 1 wherein said first conductive means are formed of thin metallic members.

3. A semiconductor circuit arrangement as defined in claim 1 wherein said second conductive means passing beneath said inlaid pattern are continuous between others of said surface portions whereby crossunder connections are defined with said first conductive means.

4. A semiconductor circuit arrangement as defined in claim 3 wherein said second conductive means are defined by diffused regions of second conductivity type in said semiconductor body.

5. A circuit arrangement comprising a semiconductor body having a predetermined pattern of recesses defining an array of first plateau-like structures, said first structures being electrically isolated one from the other, active circuit elements formed on said first structures, dielectric material formed within said recesses and defining a substantially planar topology with said first structures, and means including first conductive means formed over said dielectric material and second conductive means formed under said dielectric material for functionally interconnecting said active circuit elements whereby capacitive effects between said first conductive members and said second conductive means is minimized.

6. A circuit arrangement as defined in claim 5 wherein said pattern of recesses defines an interstitial array of second plateau-like structures said second structures being electrically isolated one from the other and from said first structures and also defining said planar topology, selected ones of said second conductive means formed beneath said dielectric material being continuous with the surface portions of said second structures selected ones of said first conductive means being connected to selected ones of said second conductive means on said surface portions of said second structures.

7. A circuit arrangement comprising a planar semiconductor body of first conductivity type, discrete regions of semiconductor material of second conductivity type formed on said planar body, dielectric means formed on said planar body and between said discrete regions to define a planar topology wherein surfaces of said discrete regions are exposed, active circuit elements formed on the surfaces of said discrete regions, and means passing beneath and over said dielectric means for functionally interconnecting said circuit elements into an operative arrangement, said dielectric means being effective to minimize capacitance between said interconnecting means.

8. A circuit arrangement as defined in claim 7 wherein at least a portion of said interconnecting means passing beneath said dielectric means are defined by diffused regions in said semiconductor body of second conductivity type.

9. A circuit arrangement as defined in claim 7 wherein said interconnecting means over said dielectric means are defined by thin metallic conductors.

References Cited

UNITED STATES PATENTS

| | | | |
|---|---|---|---|
| 3,117,260 | 1/1964 | Noyce | 317—235 |
| 3,137,796 | 6/1964 | Luscher | 307—88.5 |
| 3,158,788 | 11/1964 | Last | 317—101 |
| 3,169,892 | 2/1965 | Lemelson | 148—6.3 |
| 3,199,002 | 8/1965 | Martin | 317—234 |
| 3,258,898 | 7/1966 | Garibotti | 29—155.5 |
| 3,312,871 | 4/1967 | Seki et al. | 317—101 |

OTHER REFERENCES

Electronic Design, vol. 12, No. 8, Apr. 13, 1964, p. 12.
Electronic News, Apr. 20, 1964, p. 42.
Electronics Review, vol. 37, No. 17, June 1, 1964, p. 23.

JOHN W. HUCKERT, *Primary Examiner.*

R. F. SANDLER, *Assistant Examiner.*